(12) United States Patent
Mallari et al.

(10) Patent No.: US 12,027,483 B2
(45) Date of Patent: Jul. 2, 2024

(54) PACKAGED SEMICONDUCTOR DEVICE WITH ELECTROPLATED PILLARS

(71) Applicant: Texas Instruments Incorporated, Dallas, TX (US)

(72) Inventors: Arvin Cedric Quiambao Mallari, San Fernando (PH); Maricel Fabia Escano, Angeles (PH); Armando Tresvalles Clarina, Jr., La Trinidad (PH); Jovenic Romero Esquejo, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/404,918

(22) Filed: Aug. 17, 2021

(65) Prior Publication Data
US 2021/0375808 A1 Dec. 2, 2021

Related U.S. Application Data

(63) Continuation of application No. 16/265,194, filed on Feb. 1, 2019, now Pat. No. 11,094,656.
(Continued)

(51) Int. Cl.
*H01L 23/00* (2006.01)
*H01L 23/31* (2006.01)
*H01L 23/495* (2006.01)

(52) U.S. Cl.
CPC .......... *H01L 24/13* (2013.01); *H01L 23/3107* (2013.01); *H01L 23/49513* (2013.01);
(Continued)

(58) Field of Classification Search
CPC . H01L 24/13; H01L 24/14; H01L 2224/0401; H01L 2224/13023; H01L 23/49513; H01L 2224/11902–11903; H01L 2224/1147; H01L 2224/11462; H01L 2224/03462; H01L 2224/022; H01L 2224/03019; H01L 2224/05582; H01L 2224/1357; H01L 2224/13582; H01L 23/3107; H01L 24/03; H01L 24/11; H01L 24/48; H01L 2224/48247; H01L 21/561; H01L 2224/02166; H01L 2224/04042; H01L 2224/05022; H01L 2224/05567; H01L 2224/05568; H01L 2224/05571; H01L 23/49572; H01L 2224/05572;
(Continued)

(56) References Cited

U.S. PATENT DOCUMENTS 9,159,696 B2 10/2015 Daubenspeck et al.
2001/0040290 A1* 11/2001 Sakurai ................... H01L 24/13
257/737
(Continued)

*Primary Examiner* — Sonya McCall-Shepard
(74) *Attorney, Agent, or Firm* — Dawn Jos; Frank D. Cimino

(57) ABSTRACT

In a described example, a device includes an overcoat layer covering an interconnect; an opening in the overcoat layer exposing a portion of a surface of the interconnect; a stud on the exposed portion of the surface of the interconnect in the opening; a surface of the stud approximately coplanar with a surface of the overcoat layer; and a conductive pillar covering the stud and covering a portion of the overcoat layer surrounding the stud, the conductive pillar having a planar and un-dished surface facing away from the stud and the overcoat layer.

15 Claims, 14 Drawing Sheets

Related U.S. Application Data

(60) Provisional application No. 62/787,097, filed on Dec. 31, 2018.

(52) U.S. Cl.
CPC .............. *H01L 24/03* (2013.01); *H01L 24/05* (2013.01); *H01L 24/11* (2013.01); *H01L 24/14* (2013.01); *H01L 24/48* (2013.01); *H01L 2224/022* (2013.01); *H01L 2224/03019* (2013.01); *H01L 2224/0401* (2013.01); *H01L 2224/05124* (2013.01); *H01L 2224/05147* (2013.01); *H01L 2224/05166* (2013.01); *H01L 2224/05184* (2013.01); *H01L 2224/05582* (2013.01); *H01L 2224/05647* (2013.01); *H01L 2224/05666* (2013.01); *H01L 2224/05684* (2013.01); *H01L 2224/11011* (2013.01); *H01L 2224/11462* (2013.01); *H01L 2224/11903* (2013.01); *H01L 2224/13006* (2013.01); *H01L 2224/13082* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/1357* (2013.01); *H01L 2224/13582* (2013.01); *H01L 2224/13611* (2013.01); *H01L 2224/13639* (2013.01); *H01L 2224/13644* (2013.01); *H01L 2224/13655* (2013.01); *H01L 2224/13664* (2013.01); *H01L 2224/16245* (2013.01); *H01L 2224/48247* (2013.01)

(58) Field of Classification Search
CPC . H01L 2224/05578; H01L 2224/13005; H01L 2224/13014; H01L 2224/48464; H01L 2224/73265; H01L 2224/05124; H01L 2224/05147; H01L 2224/05166; H01L 2224/05184; H01L 2224/05647; H01L 2224/05666; H01L 2224/05684; H01L 2224/13139; H01L 2224/13144; H01L 2224/13147; H01L 2224/13155; H01L 2224/13164; H01L 2224/13611; H01L 2224/13639; H01L 2224/13644; H01L 2224/13655; H01L 2224/13664; H01L 2224/16245; H01L 2224/05139; H01L 2224/05144; H01L 2224/05155; H01L 2224/05186; H01L 2224/05639; H01L 2224/05644; H01L 2224/05655; H01L 2224/05664; H01L 2224/13111; H01L 2224/13169; H01L 21/76871–76873; H01L 24/05; H01L 2224/13006; H01L 24/16; H01L 2224/03912; H01L 2224/13082; H01L 23/3128; H01L 24/17; H01L 24/73; H01L 24/81; H01L 2224/05557; H01L 2224/05564; H01L 2224/13022; H01L 2224/13024; H01L 2224/13025; H01L 2224/16148; H01L 2224/16227; H01L 2224/73204; H01L 2225/06513; H01L 2225/06517; H01L 2224/03464; H01L 2224/0362–03622; H01L 2224/0603; H01L 24/31; H01L 23/3171; H01L 23/481; H01L 2224/03914; H01L 2224/11912; H01L 2224/81191; H01L 2224/0508; H01L 2224/0558; H01L 2224/119; H01L 2224/13021; H01L 23/49894; H01L 2224/1182; H01L 2224/1369; H01L 2224/2929; H01L 2224/11474; H01L 2224/11903; H01L 2224/13083

See application file for complete search history.

(56) References Cited

U.S. PATENT DOCUMENTS

| | | | |
|---|---|---|---|
| 2007/0045840 A1 | 3/2007 | Varnau | |
| 2007/0111374 A1 | 5/2007 | Islam et al. | |
| 2008/0211068 A1 | 9/2008 | Chen et al. | |
| 2011/0285015 A1* | 11/2011 | Song | H01L 24/13 257/737 |
| 2013/0049179 A1 | 2/2013 | Desai et al. | |
| 2013/0181340 A1* | 7/2013 | Uehling | H01L 24/11 257/737 |
| 2014/0175639 A1 | 6/2014 | Kim et al. | |
| 2015/0001712 A1* | 1/2015 | Daubenspeck | H01L 24/03 257/738 |
| 2015/0340332 A1* | 11/2015 | Rinne | H01L 24/11 257/737 |
| 2018/0061791 A1* | 3/2018 | Lin | H01L 24/05 |
| 2019/0027450 A1 | 1/2019 | Choi et al. | |
| 2019/0164947 A1* | 5/2019 | Yoo | H01L 24/81 |
| 2020/0266163 A1* | 8/2020 | Lee | H01L 21/78 |

* cited by examiner

PACKAGED SEMICONDUCTOR DEVICE WITH ELECTROPLATED PILLARS

CROSS REFERENCE TO RELATED APPLICATIONS

This application is a continuation of U.S. patent application Ser. No. 16/265,194, filed Feb. 1, 2019, which claims the benefit of Provisional Patent Application No. 62/787,097, filed Dec. 31, 2018, titled "PACKAGED SEMICONDUCTOR DEVICE WITH ELECTROPLATED PILLARS," which is hereby incorporated by reference in its entirety herein.

TECHNICAL FIELD

This disclosure relates generally to devices with electroplated pillars, and more particularly to packaged semiconductor devices with electroplated pillars, bumps, under-bump metal, or other electroplated conductive material.

SUMMARY

In a described example, a device includes an overcoat layer covering an interconnect; an opening in the overcoat layer exposing a portion of a surface of the interconnect; a stud on the exposed portion of the surface of the interconnect in the opening; a surface of the stud approximately coplanar with a surface of the overcoat layer; and a conductive pillar covering the stud and covering a portion of the overcoat layer surrounding the stud, the conductive pillar having a planar and un-dished surface facing away from the stud and the overcoat layer.

BRIEF DESCRIPTION OF THE DRAWINGS

FIGS. 1A-1B are cross sectional views of a copper pillar with a dished surface and a solder cap with a dished surface covering underlying topography, while

FIG. 3A is a cross sectional view of a copper pillar with a planar, un-dished surface covering underlying topography, while

FIGS. 6C-6F are cross sections illustrating example steps in a method for making packaged dies which contain copper pillars with planar, un-dished surfaces covering underlying topography, while

DETAILED DESCRIPTION

Figure 1A:
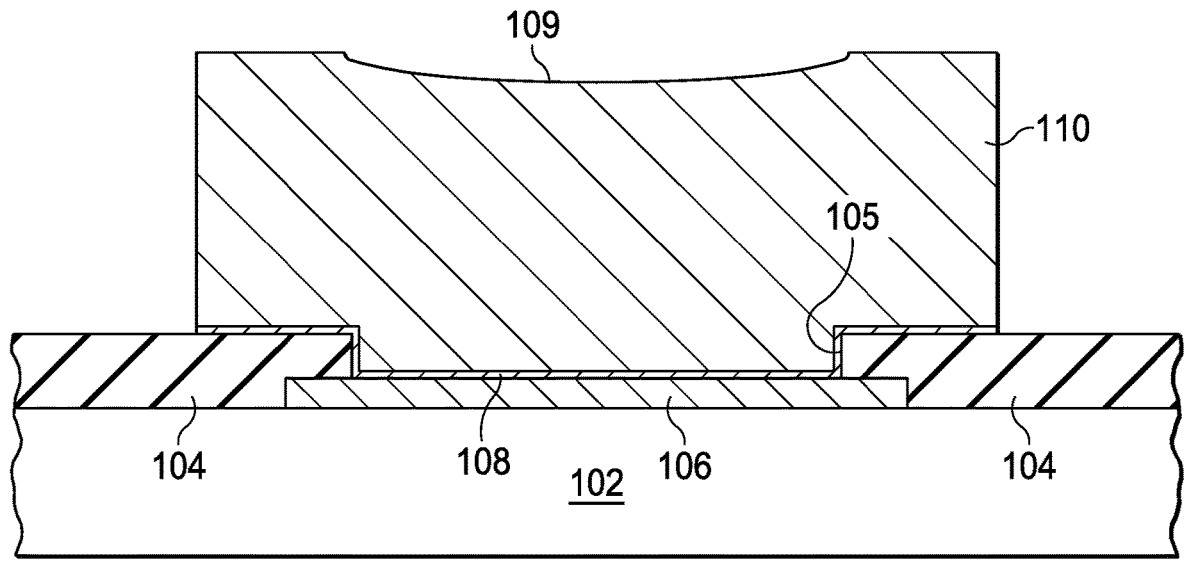

Corresponding numerals and symbols in the different figures generally refer to corresponding parts, unless otherwise indicated. The figures are not necessarily drawn to scale.

The term "planar" is used herein. As used herein, a planar surface is a surface that is substantially flat without ridges or valleys, and without dishing. A used herein, the term planar includes surfaces intended to be planar that are formed in semiconductor manufacturing, the term planar allows for variations in planarity within the capability of the semiconductor processing equipment. As used herein, a surface that is intended to be planar is also a planar surface, even though deviations that occur in manufacturing may result in some slight non-planarity in portions. The term "coplanar" is used herein. As used herein, two elements have surfaces that are "coplanar" when the two surfaces lie in the same plane. However, in manufacturing, the surfaces may deviate slightly due to manufacturing tolerances, however two surfaces that are intended to lie in the same plane are considered co-planar as the term is used herein, even if some deviation occurs in one or both surfaces in manufacturing.

The term "un-dished" is used herein. As used herein, a surface is un-dished when the surface is planar and more or less uniform across the surface without dipping or "dishing" in the surface.

The term "scribe lane" is used herein. A scribe lane is a portion of semiconductor wafer between semiconductor devices. Sometimes in related literature the term "scribe street" is used. Once processing is finished and the semiconductor devices are complete, the semiconductor devices are separated into semiconductor dies by severing the semiconductor wafer along scribe lanes that are between the semiconductor dies. This process is referred to as "singulation". Scribe lanes will be arranged on four sides of a semiconductor device and when singulated from one another, rectangular semiconductor dies are formed. The term "saw streets" is used herein. As used herein, a saw street is a portion of a lead frame strip between lead frames that have semiconductor devices mounted to them. After packaging is completed, the packaged semiconductor dies are singulated one from another by cutting through the lead frame strip in the saw streets to form individual semiconductor packages.

In the arrangements, the problem of plated pillar non-uniformity for a substrate such as a semiconductor die is solved by controlling the aspect ratios of structures filled by electroplating processes, and by forming studs prior to forming the plated pillars. In certain examples, the plated pillars are formed using copper and copper electroplating processes. The pillars form terminals for connecting the substrate to external devices.

In this description, the term "conductive pillar" is used. As used herein, a conductive pillar is a conductive structure that forms a terminal for connection to a substrate, semiconductor device or semiconductor die. The conductive pillar can also be referred to as a post, pillar, a lead or a bump. An electroplated conductive pillar can be part of a bump structure that carries a solder bump and can be referred to as an under-bump metal (UBM).

In this description, the term, "substrate" is used. A substrate as used herein is any supporting material that carries conductors. Examples include printed circuit boards, lead frames, laminates, tapes, films, fiberglass, glass reinforced epoxy substrates such as FR4, and premolded lead frames (PMLFs) which include conductive leads and mold compound in a premolded substrate. In addition, the term substrate includes semiconductor wafers, semiconductor devices and semiconductor dies. Semiconductor devices can have conductors that are coupled to a bond pad, and the conductive pillars may be formed on interconnect layers on the semiconductor devices to form electrical terminals for the semiconductor devices, allowing external connection to a printed circuit board or for wire bonding to a leadframe.

In the examples described, conductive pillars are described using electroplated copper as a material. In addition to copper, other metals that can be electroplated can be used in the arrangements, including gold, silver, palladium, and alloys of these.

FIG. 1A is a cross sectional view of a structure of a copper pillar 110 that is formed by electroplating copper on underlying metal interconnect 106. The underlying metal interconnect 106 can be copper or can another metal such as an aluminum alloy, titanium-tungsten (TiW), or tungsten (W). The underlying metal interconnect 106 can be a lead or a bond pad on an underlying substrate 102 such as a semiconductor wafer, semiconductor die or on a printed circuit board. The substrate 102 under the metal interconnect 106 can be any nonconductive material such as silicon dioxide, silicon nitride, polyimide, sapphire, and other insulative or dielectric materials.

An overcoat layer 104, sometimes referred to as a "protective overcoat" or "PO" layer, covers the surface of the substrate 102 and covers the surface of the metal interconnect 106, except for an opening in the overcoat layer 104 that exposes a portion of the surface of the metal interconnect 106. A seed layer 108 covers the surface of the overcoat layer 104, covers the sidewalls 105 of the opening in the overcoat layer, and covers the surface of the metal interconnect 106 that is exposed in the layer 104 opening. A conductive pillar (sometimes referred to a "pillar bump"), in this example a copper pillar 110, is formed over the interconnect 106. The topography of the opening in the overcoat layer 104 gets replicated in the surface of the copper pillar 110 as it is electroplated on the seed layer 108. The surface of the copper pillar 110 replicates the topography of the opening in the layer 104 and is dished, the dished surface is shown as element 109. The copper pillar 110 will form an external terminal for connecting to the substrate 102, for example, by mounting the copper pillar 110 to a circuit board or substrate with conductive pads for making the connection.

Figure 1B:
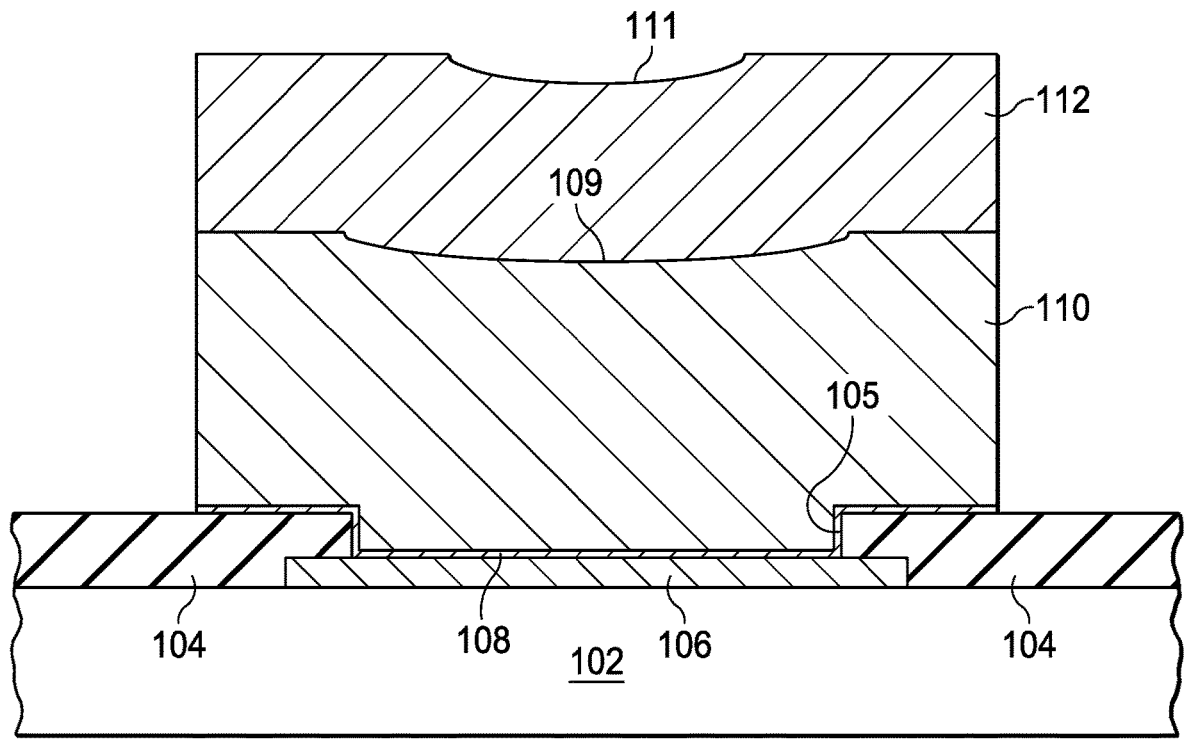
Figure 1C:
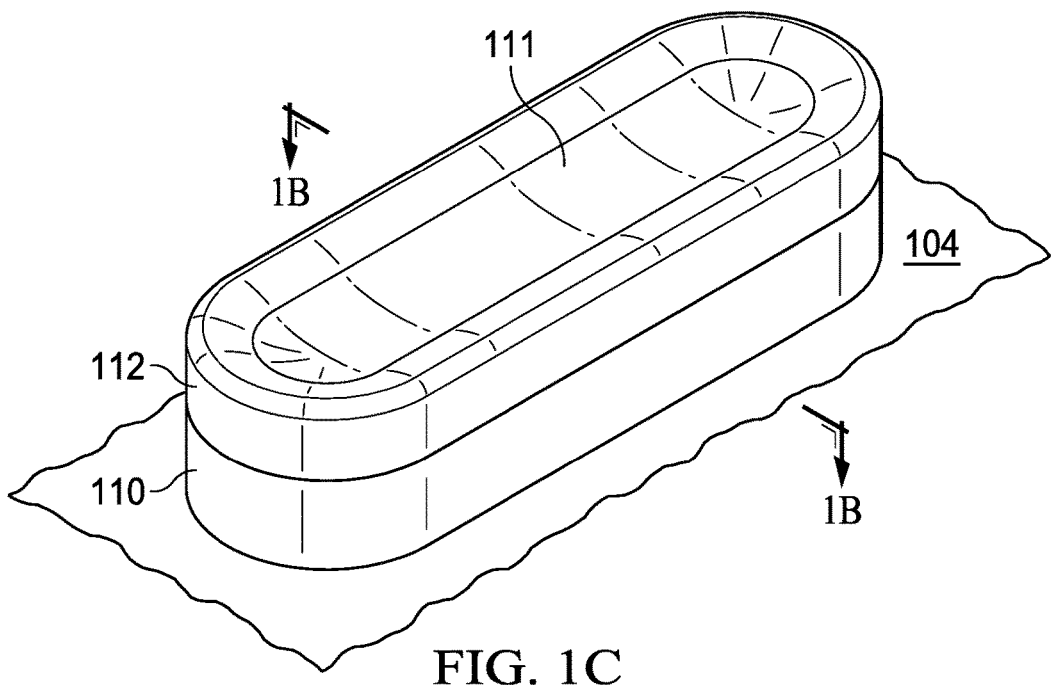
FIG. 1C is a projection view of the dished surface of a solder cap on a copper pillar covering underlying topography.

FIGS. 1B and 1C show the copper pillar described in FIG. 1A with a solder cap 112 on the surface of the copper pillar 110. A solder cap 112 is electroplated on the surface of the copper pillar 110 when the copper pillar 110 is to be flip-chip mounted on another substrate such as a lead frame or a circuit board (not shown). FIG. 1B shows a cross section of the copper pillar 110 with a solder cap 112 taken along the dashed line 1B-1B' in FIG. 1C. FIG. 1C is a projection view of a copper pillar 110 with the solder cap 112. As shown in FIGS. 1B and 1C, the dished surface 109 on the copper pillar 110 is replicated on the surface 111 of the solder cap 112.

Figure 2:
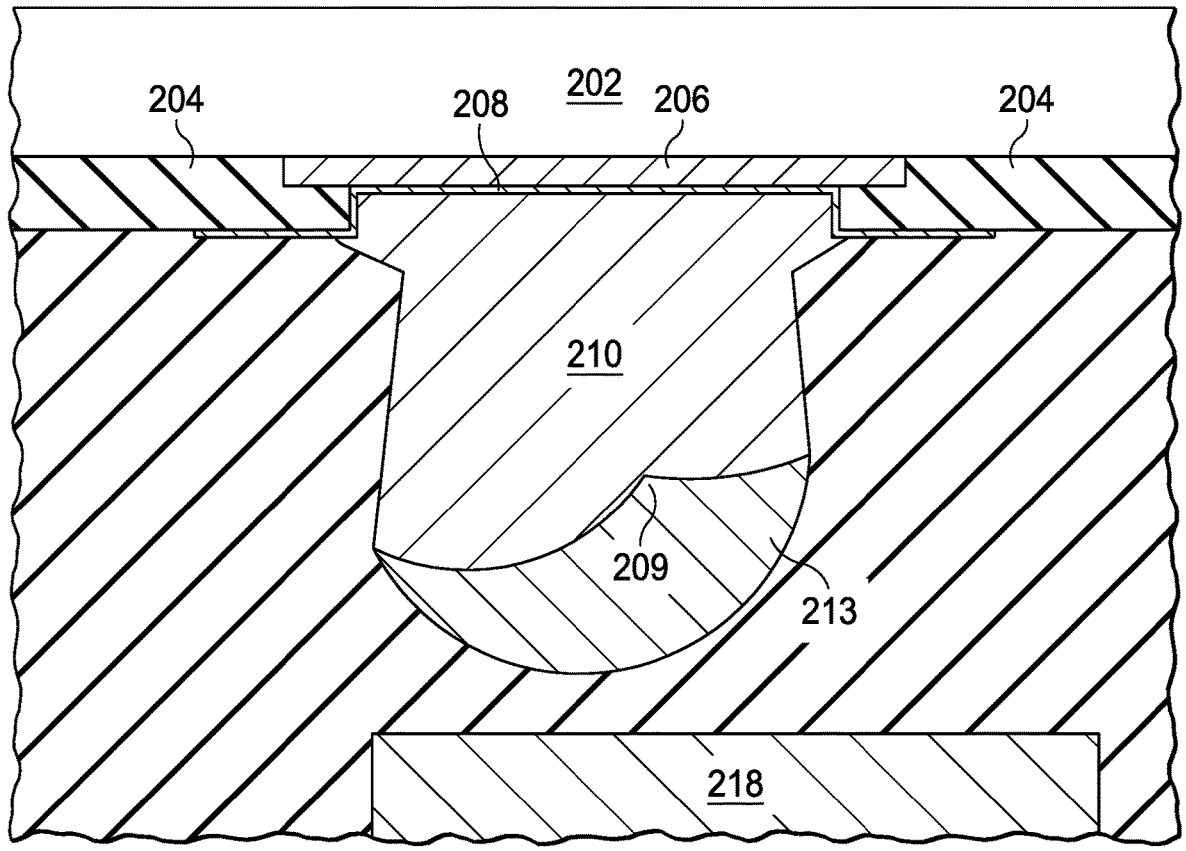
FIG. 2 is a cross sectional view of a copper pillar with a dished surface and with a solder cap that has failed to form a solder bond to an underlying pad during flip-chip bonding.

FIG. 2 illustrates in an example a flip chip bonding of a copper pillar such as 110 with a dished surface like 109 (see FIG. 1B). During a flip chip bonding procedure, the substrate 202/copper pillar 210/solder cap 212 assembly is inverted or "flipped" with the copper pillar 210 and solder cap 212 positioned above a substrate lead 218 on an underlying substrate such as a lead frame or a circuit board. The assembly is heated to melt the solder cap 212 and to cause it to reflow and form a solder bond between the copper pillar 210 and the substrate lead 218. As shown in FIG. 2, when the solder cap (see 112, FIG. 1C) is melted, surface tension forms it into a solder ball 213 with a hemispherical surface. In FIG. 2, the solder ball 213 fills the dished surface 209 of the copper pillar 210 and is not sufficiently thick to make contact with the underlying substrate lead 218 (note that while only one copper pillar 210 is shown in FIG. 2, in a practical application many copper pillars will be mounted to the substrate simultaneously). If the surface of the copper pillar 210 were not dished, the solder ball 213 will be sufficiently thick to make a solder bond to the underlying substrate lead 218. In this example the surface of copper pillar 210 is dished, and thus the solder ball 213 fails to bond properly. Because the solder ball 213 fails to contact the substrate lead 218, a solder joint fails to form and make electrical connection. This failed connection results in a failed packaged semiconductor device which produces costly scrap.

Figure 3A:
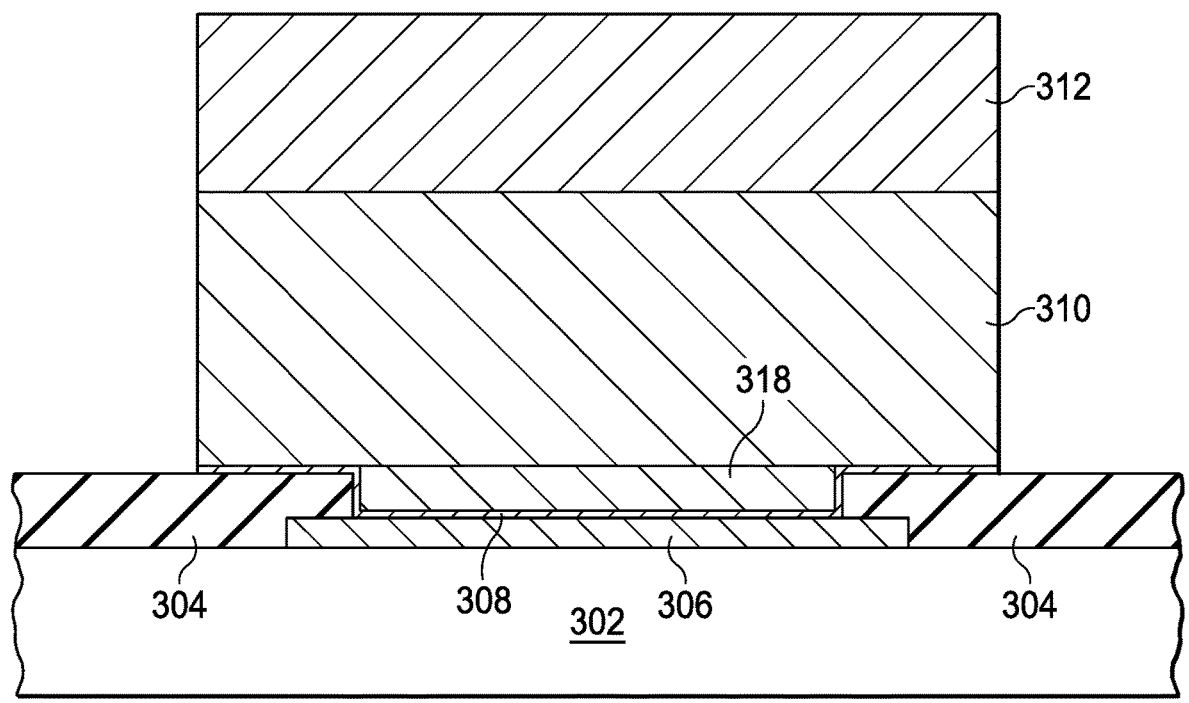
Figure 3B:
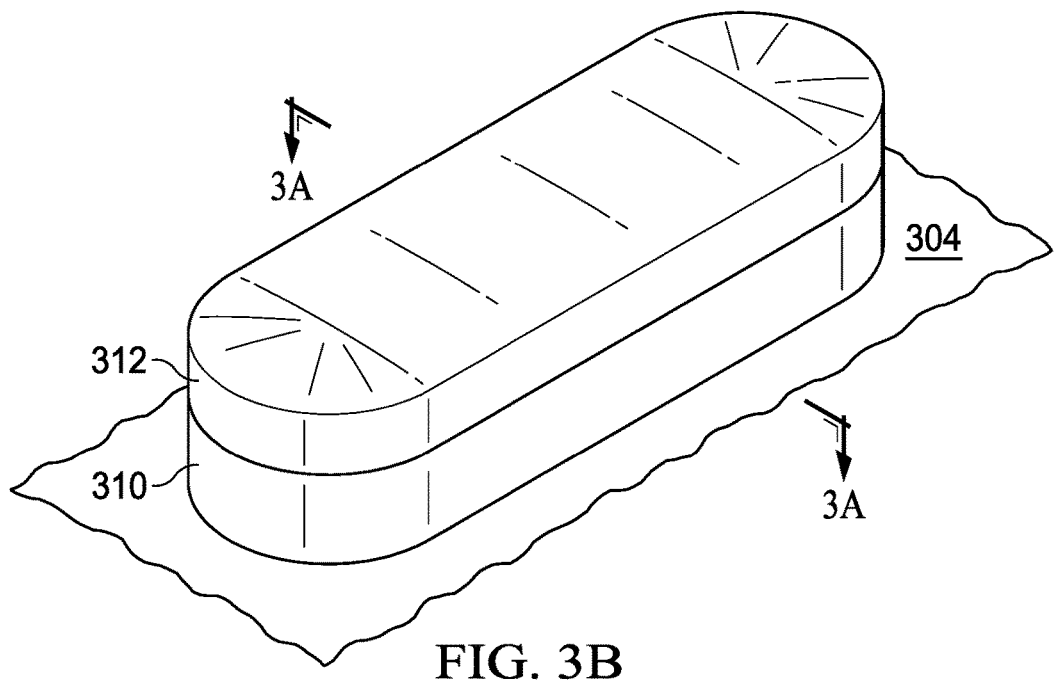
FIG. 3B is a projection of a copper pillar with a planar, un-dished surface covering underlying topography.

FIG. 3A shows a cross sectional view of an electroplated copper pillar 310 with a solder cap 312 that is electroplated over underlying topography along dashed line 3A-3A in FIG. 3B. FIG. 3B is a projection view of the electroplated copper pillar. The copper pillar 310 and the solder cap 312 have planar, un-dished surfaces facing away from the interconnect and overcoat 304 beneath the copper pillar 310. In FIGS. 3A-3B similar reference labels are used for similar elements as are shown in FIGS. 1A-1C, for clarity. For example, copper pillar 310 in FIGS. 3A-3B corresponds to copper pillar 110 in FIGS. 1A-1C.

Example arrangements include a process where a conductive stud is formed prior to the conductive pillar formation. In one example, shown in FIG. 3A, a stud 318 on the underlying metal interconnect 306 fills an opening in the overcoat layer 304. The stud 318 removes the topography of the overcoat layer 304 opening. The surface of the stud 318 is about the same height as the surface of the overcoat layer 304, forming a planar surface. The surface of the copper pillar 310 electroplated on this planar surface is also planar and un-dished. The stud 318 can be electroplated on the surface of the underlying metal interconnect 306 exposed by the opening in the overcoat layer 304. The stud 318 can be any electroplated metal. For purposes of illustration the stud in FIG. 3 is a copper stud 318. The metal interconnect 306 is on a substrate 302 made of a nonconductive material. The metal interconnect can, in some examples, be aluminum or copper or alloys thereof. The substrate 302 can be, for example, a semiconductor wafer, a printed circuit board, or an interconnect redistribution substrate. The overcoat 304 can be a dielectric material such as, for example, silicon dioxide, silicon nitride, silicon oxynitride, or a polymer material such as polyimide.

The copper stud 318 fills the opening in the overcoat layer 304 and essentially eliminates the topography caused by the opening in the overcoat layer 304. The surfaces of the copper stud 318 and the overcoat 304 are approximately level with each other forming a planar, un-dished surface. Electroplating a copper pillar 310 on a planar, un-dished surface produces a copper pillar 310 with a planar, un-dished surface facing away from the overcoat layer 304. Copper pillar 310, with the planar, un-dished surfaces significantly improve yield during flip-chip assembly (when compared to prior copper pillars) and improve reliability during use.

FIGS. 4A-4L are a series of cross sectional views illustrating the major manufacturing steps for making electroplated copper pillars with un-dished, planar surfaces over underlying topography. In FIGS. 4A-4L similar reference labels are used for similar elements as are shown in FIGS. 1A-1C, for clarity. For example, copper lead 406 in FIGS.

4A-4L corresponds to copper lead 106 in FIGS. 1A-1C. FIG. 5 is a flow diagram describing the manufacturing steps in FIGS. 4A-4L.

Figure 4A:
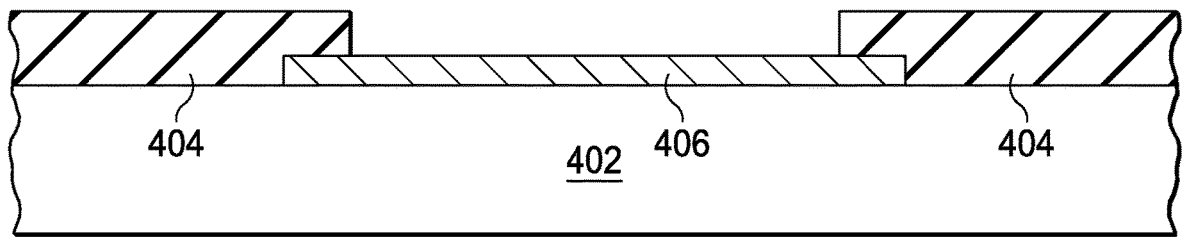
FIGS. 4A-4L are cross section views of the major steps for forming a copper pillar with a planar, un-dished surface on underlying topography.
Figure 5:
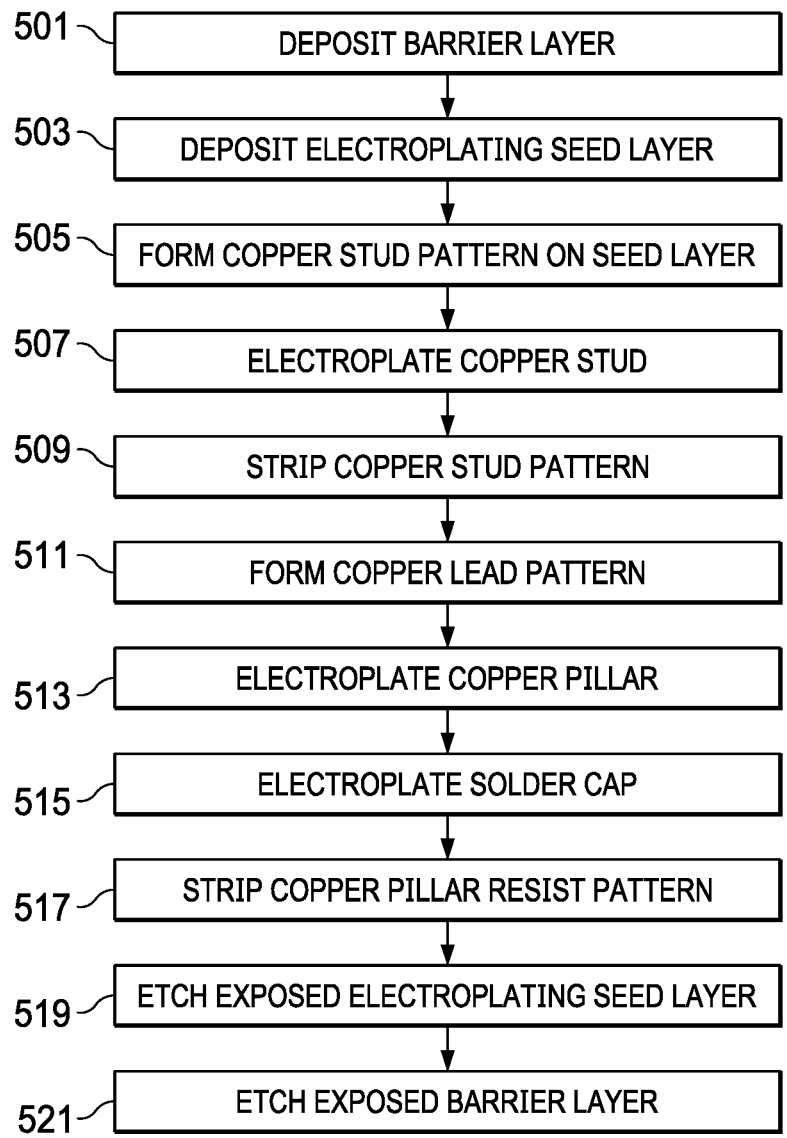
FIG. 5 is a flow diagram for a method such as shown in the steps of FIGS. 4A-4L.

FIG. 4A shows a metal interconnect 406 on a substrate 402. The metal interconnect 406 can be a metal such as aluminum, copper, titanium tungsten (TiW), tungsten, and alloys thereof. For illustration, the metal interconnect 406 is copper. An overcoat (also referred to as protective overcoat or PO) layer 404 covers the substrate 402 and covers the copper interconnect 406 except for an opening in the layer 404, which exposes a portion of the surface of the copper interconnect 406. The layer 404 can be a dielectric such as silicon dioxide, silicon nitride, silicon oxynitride, or a polymer such as polyimide. In arrangements the layer 404 has a thickness of 3.5 μm to 7 μm. In an arrangement the layer is a 5 μm thick layer of silicon dioxide. The substrate can be a nonconductive material. The substrate can be a semiconductor wafer, a circuit board, and an interconnect redistribution substrate. In an arrangement the substrate is a semiconductor wafer.

Figure 4B:
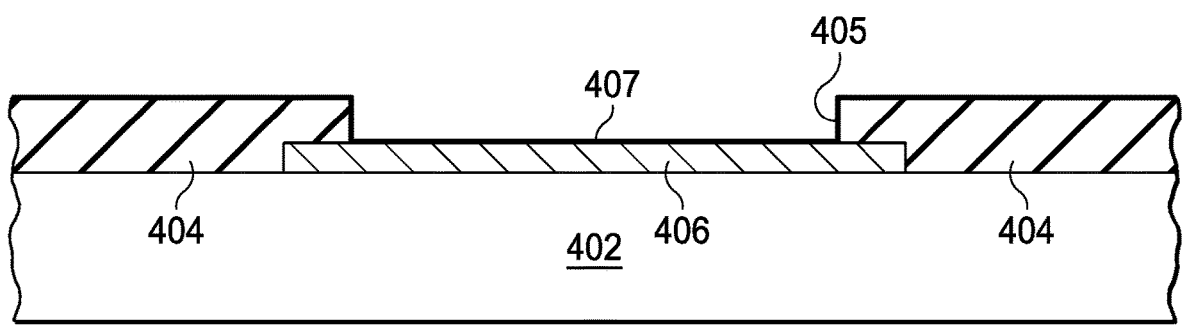

In FIG. 4B (step 501, FIG. 5) a barrier layer 407 is deposited covering the surface of the overcoat layer 404 overlying the substrate 402, the sidewalls 405 of the opening in the overcoat layer 404, and the surface of the copper interconnect 406 exposed in the opening of the overcoat 404. The barrier layer 407 can be a material such as TiW, tantalum nitride (TaN), and titanium nitride (TiN). In an arrangement the barrier layer 407 is 300 nm of TiW. The barrier layer will impede undesirable diffusion of copper material to be electroplated into the underlying materials, and some of the barrier materials further provide added adhesion to the interconnect 406.

Figure 4C:
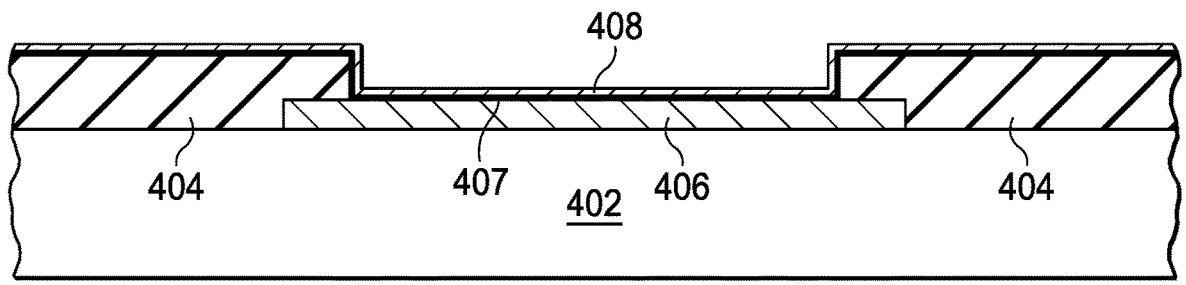

In FIG. 4C an electroplating seed layer 408 is deposited on the barrier layer 407. The electroplating seed layer 408 can be a metallic material such as gold, silver, nickel, or copper. In an arrangement the electroplating seed layer 408 is a layer having a thickness of about 200 nm of copper. In an example this layer is deposited using sputter deposition, although it could be deposited in another manner.

Figure 4D:
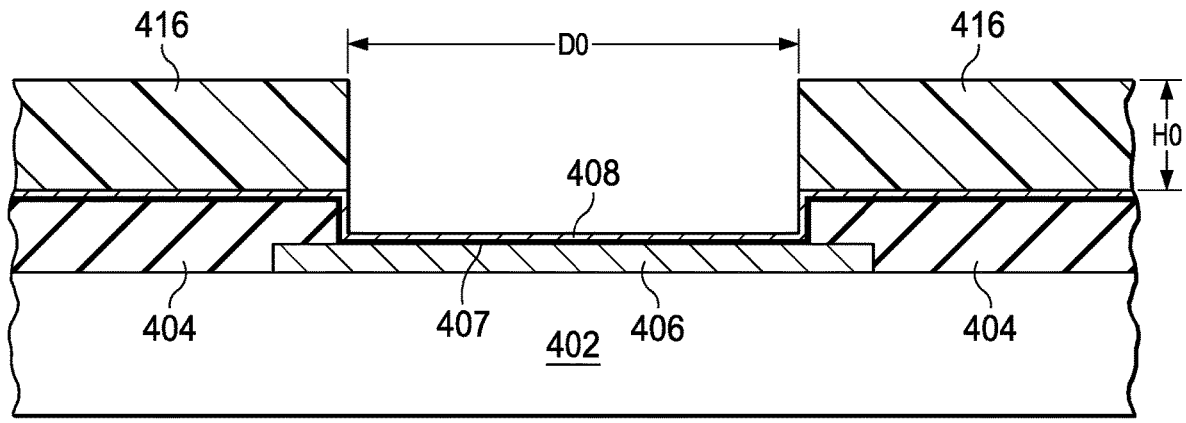

A stud photoresist pattern 416 in FIG. 4D covers the seed layer 408 with an opening exposing the seed layer 408 that covers the metal interconnect 406 in the bottom of the opening in the layer 404. The opening in the stud photoresist pattern 416 is smaller than the opening in the layer 404. This smaller opening prevents the stud (418, FIG. 4E) metal from electroplating on top of the overcoat layer 404. If stud 418 metal is electroplated on top of the overcoat layer 404, later when the copper pillar 410 is electroplated, a ridge or mound will form on the surface of the copper pillar (410, FIG. 4K) over the electroplated stud 418 material. The opening in the stud photoresist pattern 416 is between one alignment tolerance and about 2 μm smaller than the opening in the overcoat layer 404. In an arrangement the stud photoresist pattern is about 17 μm thick. As shown in FIG. 4D, the opening has a diameter D0 and a height H0. The ratio of the height to the diameter forms an aspect ratio (A/R). In electroplating, an opening with a lower aspect ratio will have improved fill with fewer voids. In the arrangements, the aspect ratio for the metal stud plating is less than 2, and in one example, about 0.6 with a height of 24 μm to a diameter of 40 μm. In contrast, when the copper pillar is formed on the underlying interconnect layer using a prior process as shown in FIGS. 1A-1B, in a similar semiconductor fabrication process, the aspect ratio A/R was about 2.425 for a single electroplating step.

Figure 4E:
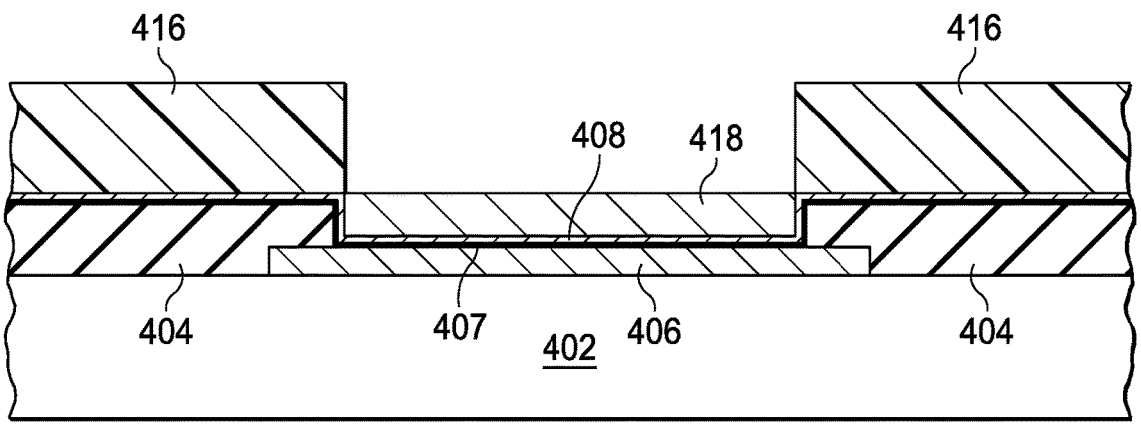
Figure 4F:
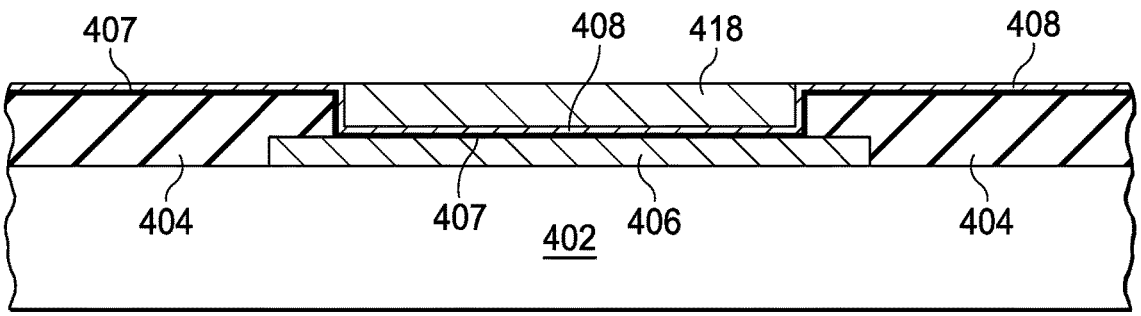

In FIG. 4E, (step 507, FIG. 5) a stud 418 is electroplated to a thickness approximately equal to the thickness of the overcoat layer 404 plus and/or minus about ten percent. The photoresist 416 should have a thickness of at least 2 μm. Stud 418 can be of any electroplated metal such as silver, gold, nickel, palladium, and copper. For purposes of illustration a copper stud 418 is used. The surface of the stud 418 away from the seed layer 408 is approximately coplanar with the surface of the overcoat layer 404 forming a planar, un-dished surface. The stud has a thickness that is approximately equal to the thickness of the layer 404 and may vary by plus or minus ten percent. In an example arrangement the thickness of the overcoat layer 404 is approximately 5 μm and the thickness of the plated copper stud 416 is between about 4.5 μm and 5.5 μm. The stud photoresist pattern 416 is removed in FIG. 4F (step 509).

Figure 4G:
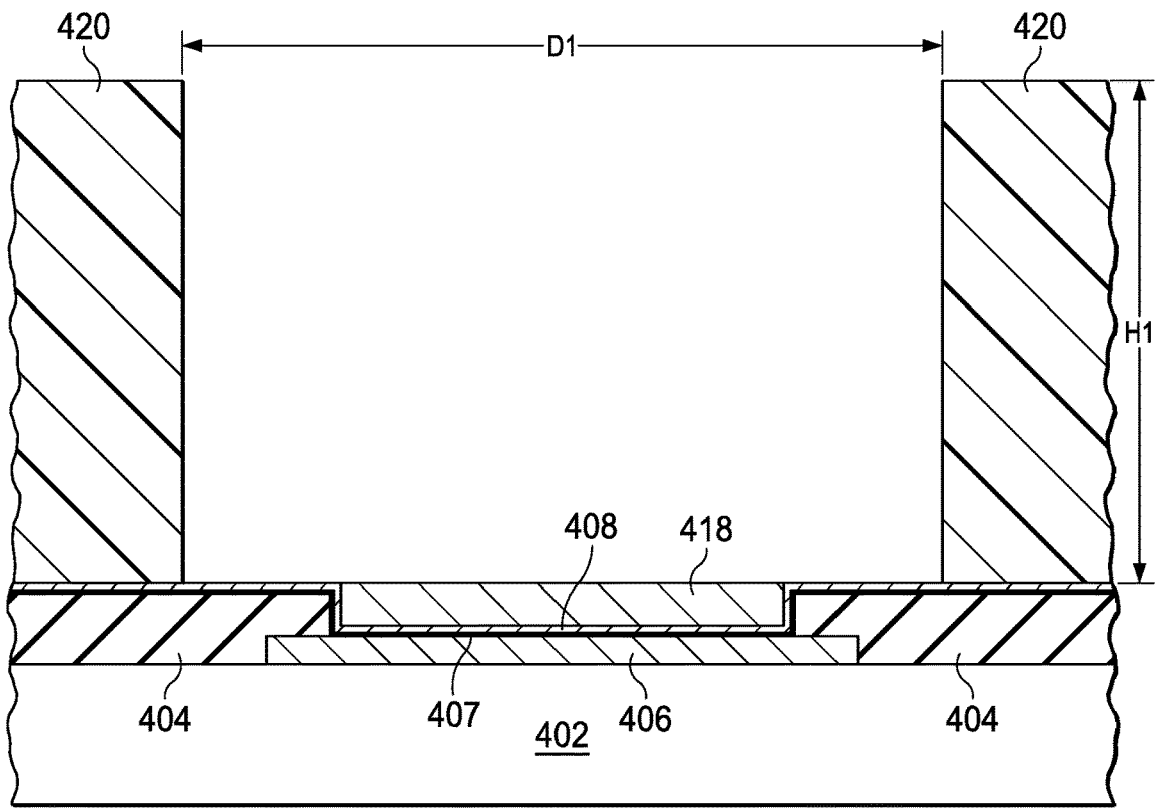

In FIG. 4G, a copper pillar photoresist pattern 420 is shown formed on the overcoat layer 404 with an opening surrounding the copper stud 418. Because the copper stud 416 has already been formed in a prior step, the aspect ratio for this electroplating step can also be reduced over prior approaches, and can be made to be less than 2. In an example, the height H1 was 90 μm and the diameter D1 was 75 μm; the resulting aspect ratio was 1.2. The opening in the photoresist pattern 420 in which the copper pillar (410, FIG. 4K) is to be electroplated, is at least 7.5 μm larger than the copper stud 418 on all sides. The thickness of the copper pillar photoresist pattern 420 depends upon the height of the copper pillar 410 to be formed and is targeted to be at least about 120% the thickness of the copper pillar 410. The photoresist 420 can be thicker if a bond metal 412, (see FIG. 4I) such as solder or a solderable metal 412 is to be electroplated on the surface of the copper pillar 410 in a step following the electroplating of the copper pillar 410 (see FIG. 4H) as is further describe hereinbelow. In example arrangements the thickness of the photoresist is in the range of 42 μm and 150 μm and the resulting copper pillar 410 thickness is between about 35 μm and 120 μm. In another arrangement the thickness of the copper pillar photoresist pattern 420 is 90 μm and the resulting copper pillar thickness is 65 μm.

Figure 4H:
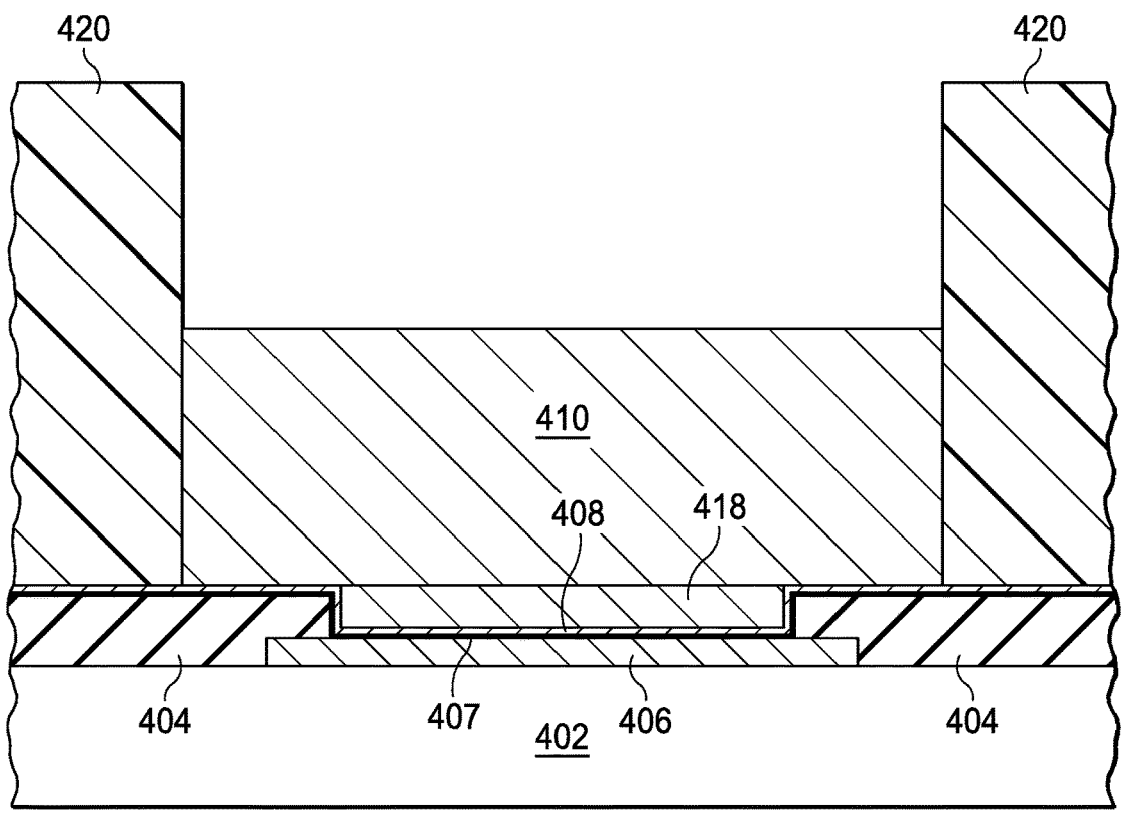

In FIG. 4H (step 513) the copper pillar 410 is electroplated on the seed layer 408 and on the copper stud 418 in the opening in copper pillar photoresist pattern 420. Since the surfaces of the copper stud 418 and the surrounding layer 404 are approximately coplanar as described hereinabove, the outer surface of the resulting electroplated copper pillar 410 facing away from the protective overcoat is also approximately planar and is un-dished. If the copper stud 416 is electroplated slightly thicker than the overcoat layer 404 the surface of the copper pillar 410 can be approximately planar or can be slightly convex. Since more reliable solder bonds and more reliable ball bonds are formed on planar or slightly convex surfaces than on dished surfaces, use of the arrangements results in yield improvement during packaging, and reliability during usage is improved. In another example arrangement the electroplated copper pillar 410 thickness is 50 μm.

Figure 4I:
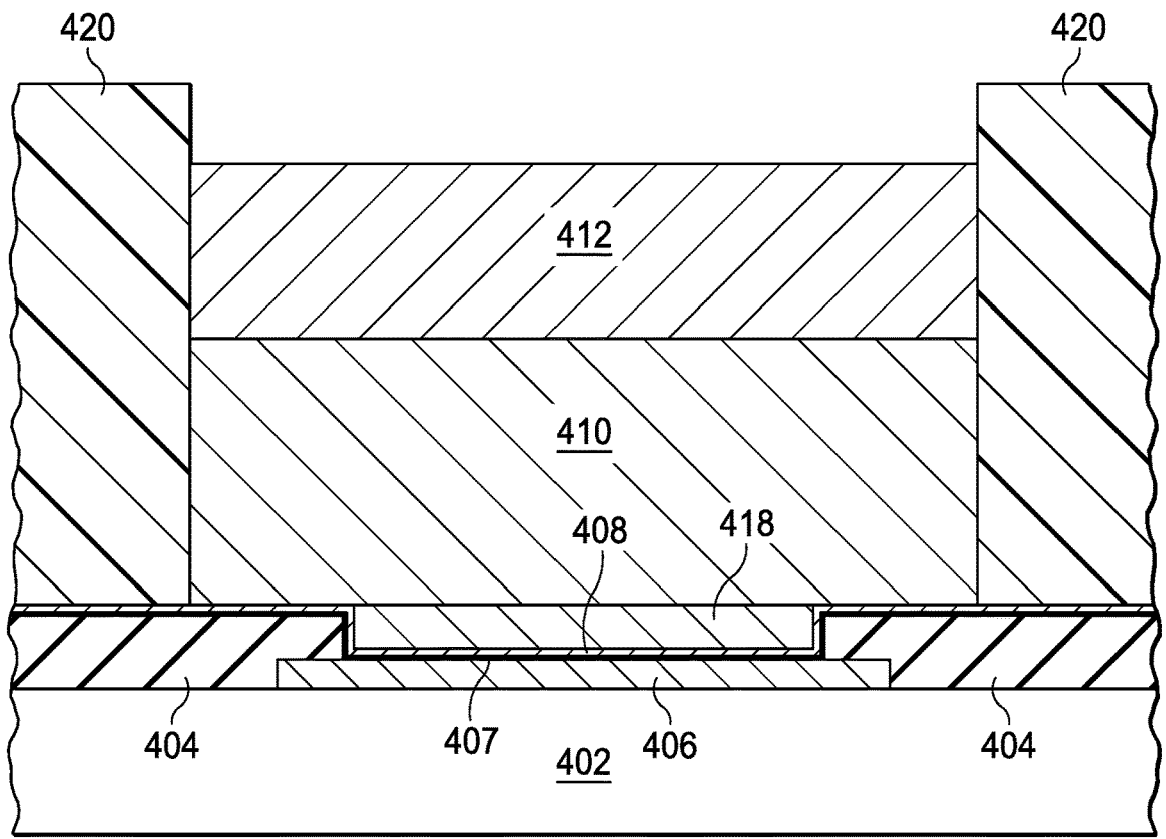

In FIG. 4I a layer of bond metal 412 is electroplated onto the surface of the copper pillar 410. This step is optional. In some arrangements the copper pillar does not have a layer of bond metal 412 on the surface. The bond metal 412 can be solder arranged for flip-chip bonding. In alternative arrangements the bond metal 412 can be a solderable metal for wire bonding. In an arrangement the layer 412 is of tin/silver/copper solder or palladium/nickel/copper solder and has a thickness between about 3.3 μm and 25 μm. If a wire bonding ball bond is to be formed to the surface of the copper pillar 410, the bond metal 412 can be a layer of solderable metal such as an electroplated layer of nickel followed by an electroplated layer of palladium. Other solderable metals include silver, tin, nickel, gold, palladium, electroplated nickel and immersion gold (ENIG), and electroplated nickel, electroplated palladium and immersion gold (ENEPIG), multiple layers of these materials, and alloys thereof.

Figure 4J:
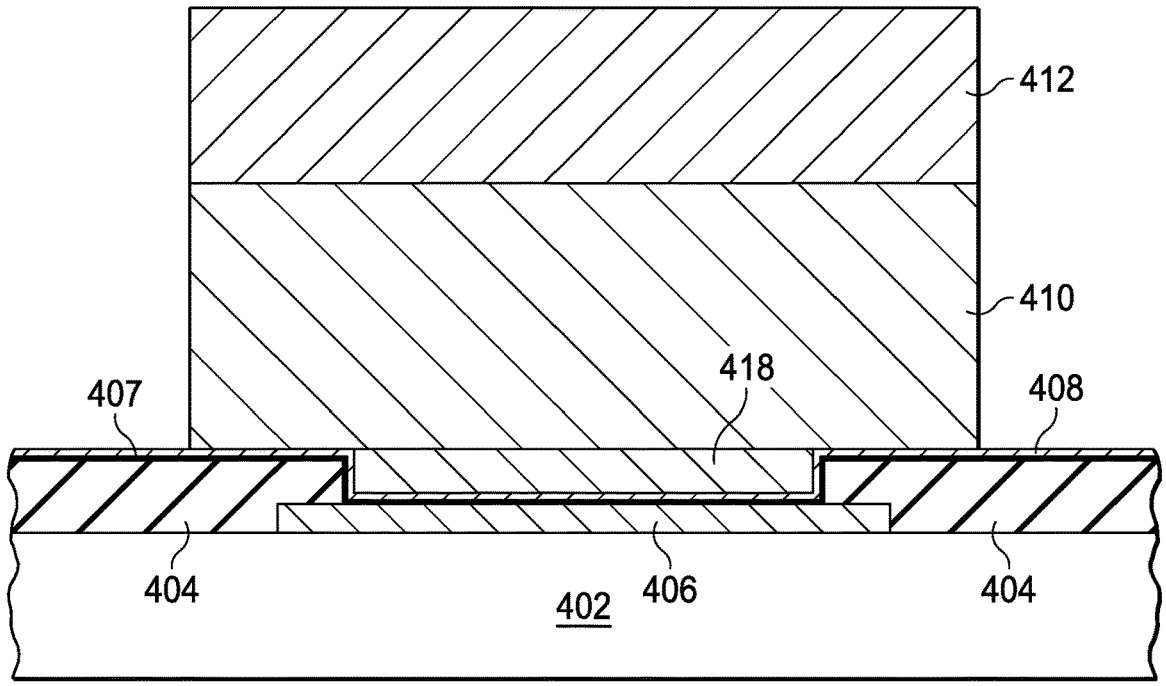

FIG. 4J shows the copper pillar 410 assembly with the copper pillar photoresist layer 420 removed. When the photoresist layer 420 is removed, the seed layer 408 and the adhesion/barrier layer 407 is exposed on the surface of the overcoat layer 404 surrounding the copper pillar 410.

Figure 4K:
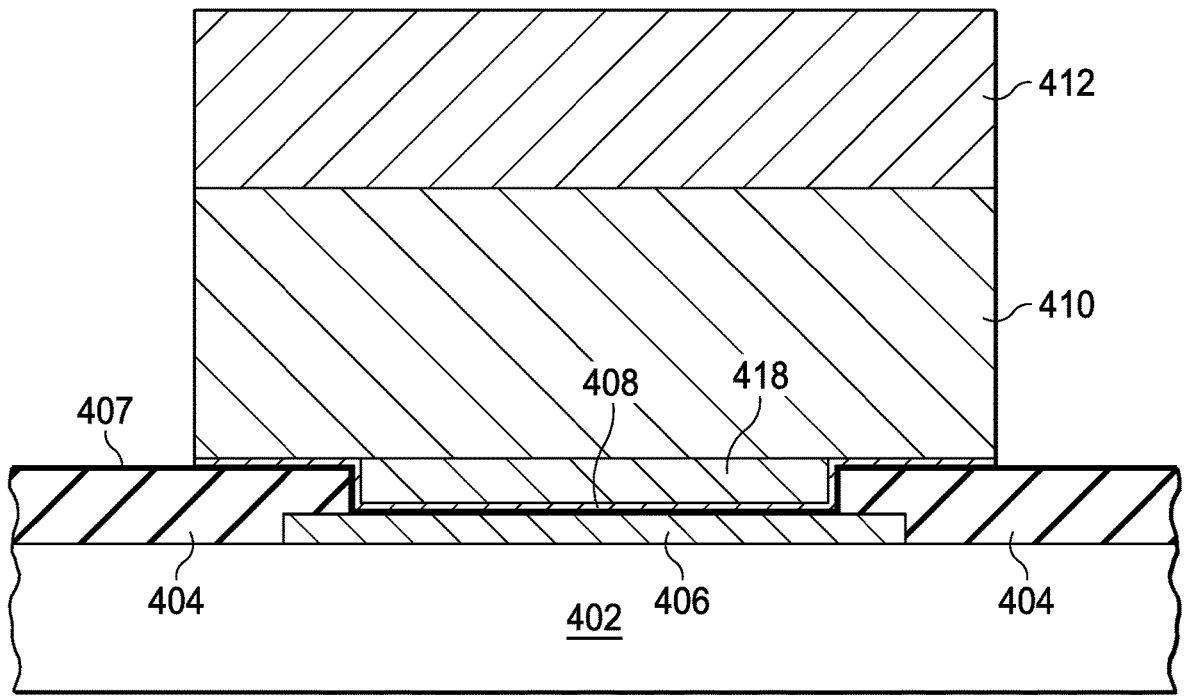

In FIG. 4K, step 519, the assembly is shown after a dilute acid is used to etch the exposed seed layer 408 from the surface of the adhesion/barrier layer 407 surrounding the copper pillar 410. In an arrangement the seed layer 408 is 200 nm copper, while the dilute acid is sulfuric acid ($H_2SO_4$) or phosphoric acid ($H_3PO_4$).

Figure 4L:
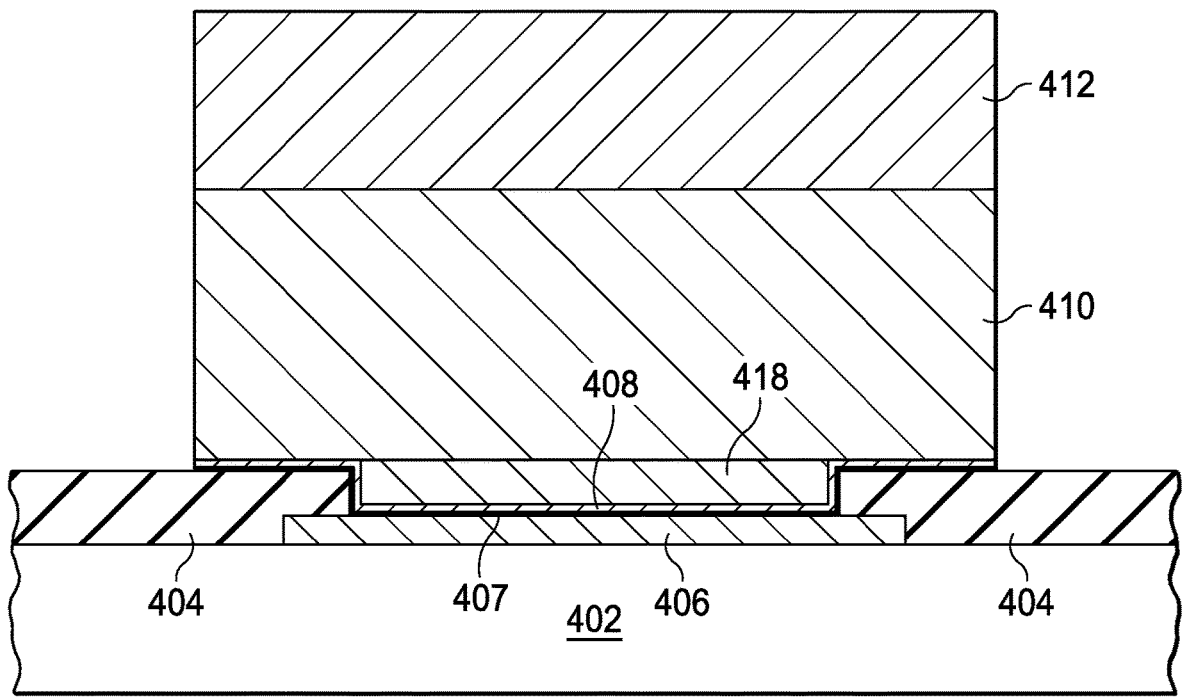

In FIG. 4L, step 521 in FIG. 5, a cross section illustrates the assembly after wet etchant is used to etch away the exposed barrier layer 407 from the surface of the overcoat layer 404 surrounding the copper pillar 410. In an arrangement the barrier layer is 300 nm of TiW and the wet etchant is dilute hydrogen peroxide ($H_2O_2$). Other etchants can be used.

FIGS. 6A-6F illustrate in a series of cross sectional views the major steps in flip-chip packaging a semiconductor device containing copper pillars with planar, un-dished surfaces such as are described hereinabove. In FIGS. 6A-6F similar reference labels are used for similar elements as are shown in FIGS. 1A-1B, for clarity. For example, substrate 602 in FIGS. 6A-6F corresponds to substrate 102 in FIGS. 1A-1B. FIG. 7 is a flow diagram with steps describing the cross sections illustrated in FIGS. 6A-6F.

Figure 6A:
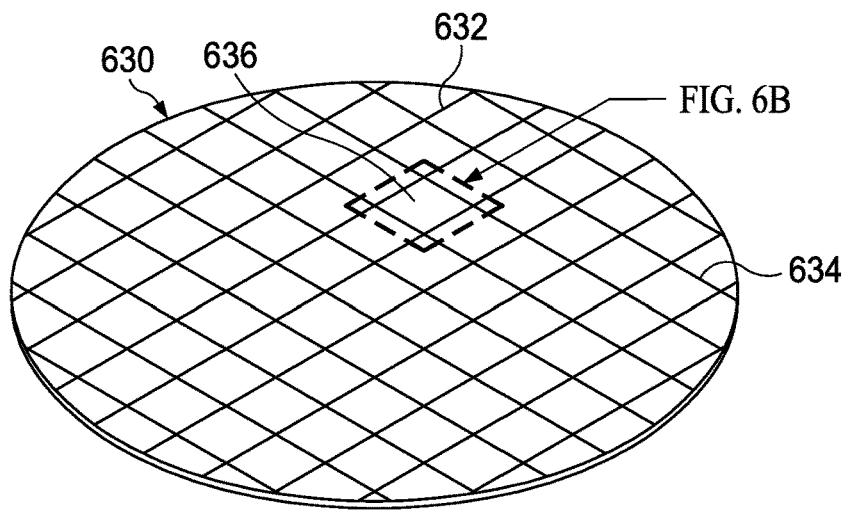
FIGS. 6A and 6B are projections of a semiconductor wafer and a singulated semiconductor die, respectively.
Figure 7:
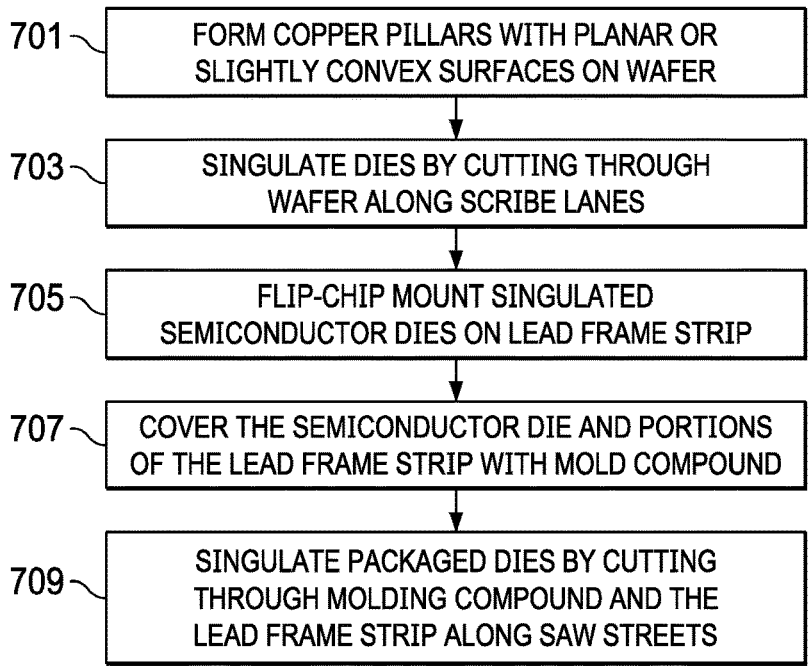
FIG. 7 is a flow diagram describing the steps shown in FIGS. 6A-6G.

FIG. 6A shows a semiconductor wafer 630 with dies 636 separated by horizontal 632 and vertical 634 scribe lanes. Dies 636 are semiconductor devices with copper pillars 610 with planar, un-dished surfaces are formed on the dies 636 (step 701, FIG. 7).

Figure 6B:
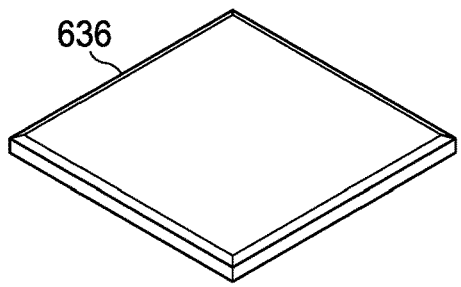

FIG. 6B shows an expanded view of one 636 of the dies that is singulated by cutting through the wafer 630 along horizontal 632 and vertical 634 scribe lanes next to the die 636 (step 703).

Figure 6G:
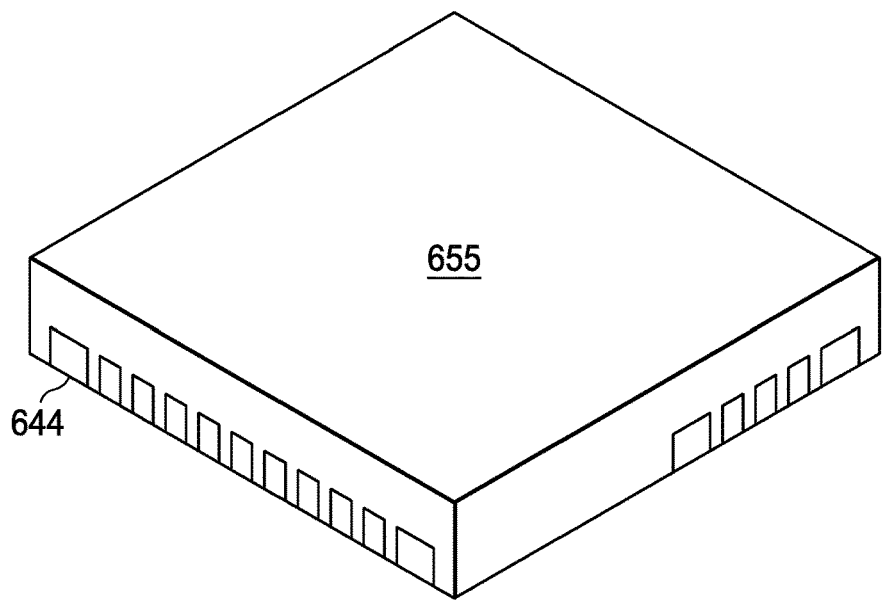
FIG. 6G is a projection illustrating a quad., flat, no lead (QFN) packaged semiconductor die.
Figure 6C:
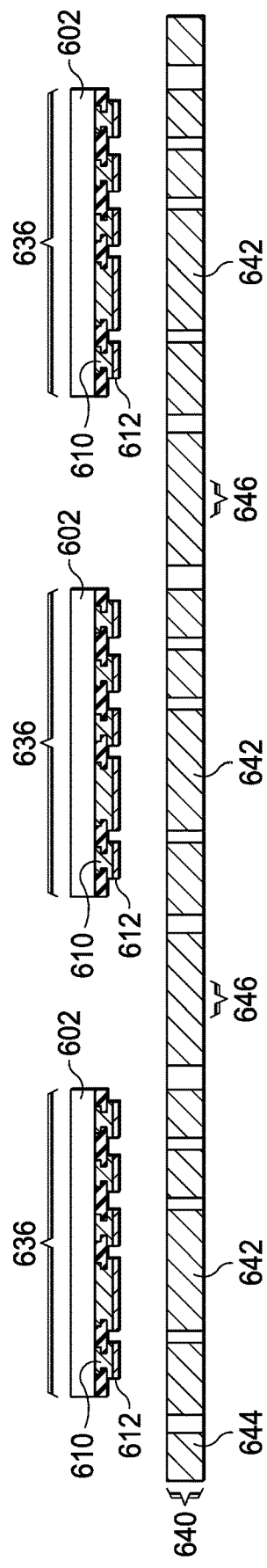

In FIG. 6C, dies 636 are positioned over a lead frame strip 640 with lead frame mounting pads 642 and lead frame leads 644. The dies 636 are inverted ("flipped") with the solder caps 612 on the surface of the copper pillars 610 aligned with a lead frame mounting pads 642 on the lead frame strip 640. Individual lead frames are connected together by saw streets 646 of lead frame material.

Figure 6D:
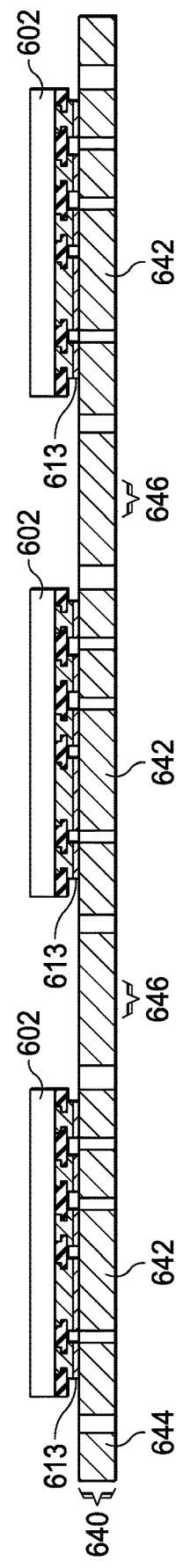

In FIG. 6D, (step 705) solder bonds 613 are formed between the copper pillars 610 on the dies 636 and the lead frame mounting pads 642 to mount the dies 636 on the lead frame strip. The planar, un-dished surfaces of the copper pillars 610 form consistent and reliable solder bonds 613 that improve device yield. In an example process, the solder bonds are formed with a peak temperature of about 250 degrees Celsius, and a processing time of about 45-60 seconds at a temperature above 220 degrees Celsius. Other processing times and temperatures can be used depending on the solder material used.

Figure 6E:
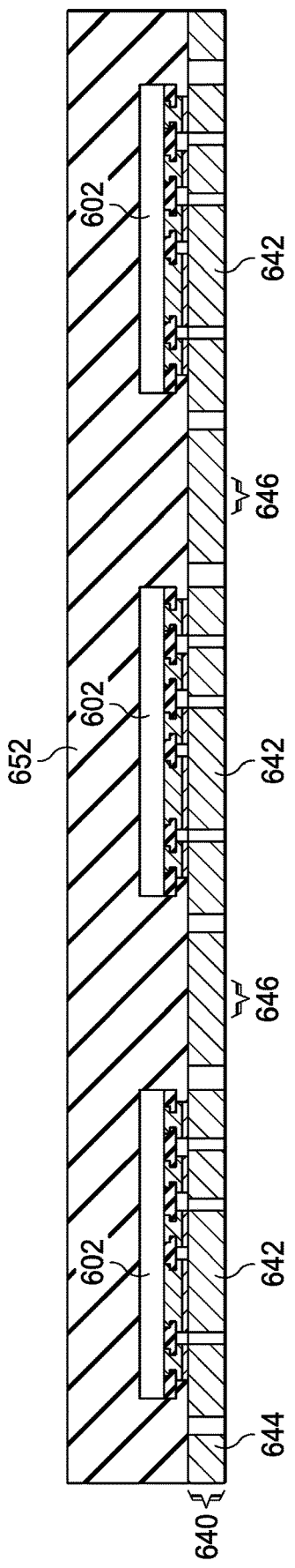

In FIG. 6E, (step 707) the dies 636 and a portion of the lead frame strip are covered with mold compound 652. In this example a block mold operation is shown, where the mold compound forms a block covering portions of the lead frame strip 640 including the dies 636, while a portion of the leads 644 on the lead frame strip 640 remain uncovered. As described hereinbelow, portions of the leads remain uncovered to facilitate electrical connection when the packaged dies 654 (see FIG. 6F) are later mounted on a substrate such as a circuit board or interconnect redistribution substrate.

Figure 6F:
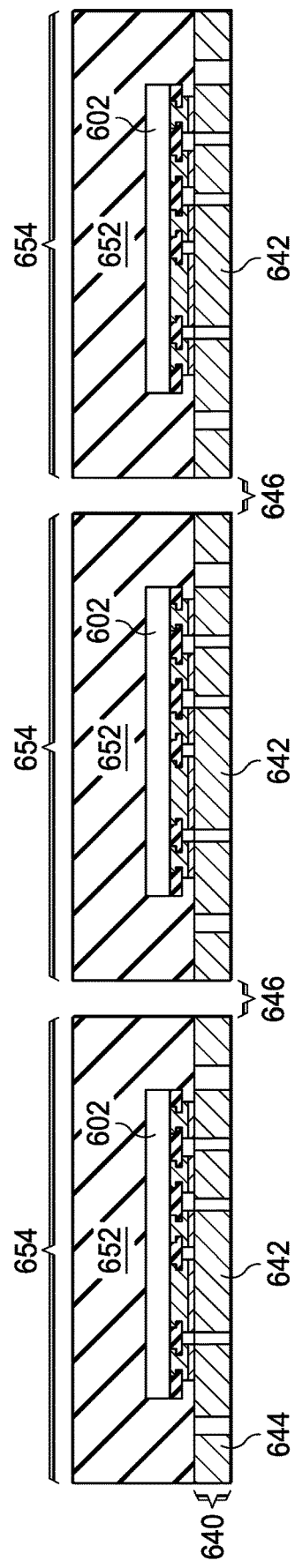

In FIG. 6F (step 709) individual packaged die 654 are singulated by cutting or sawing through mold compound 652 and the lead frame 640 in the saw streets 646. The copper pillars 610 with planar, un-dished surfaces produce packaged dies 654 with higher yield and with fewer reliability failures.

FIG. 6G shows a projection view of a packaged die in a quad flat no lead (QFN) package 655. A portion of the lead frame leads 644 are exposed on the sides of the QFN package 655 to facilitate electrical connection and mounting of the QFN package 655 to another substrate such as a circuit board.

Figure 8:
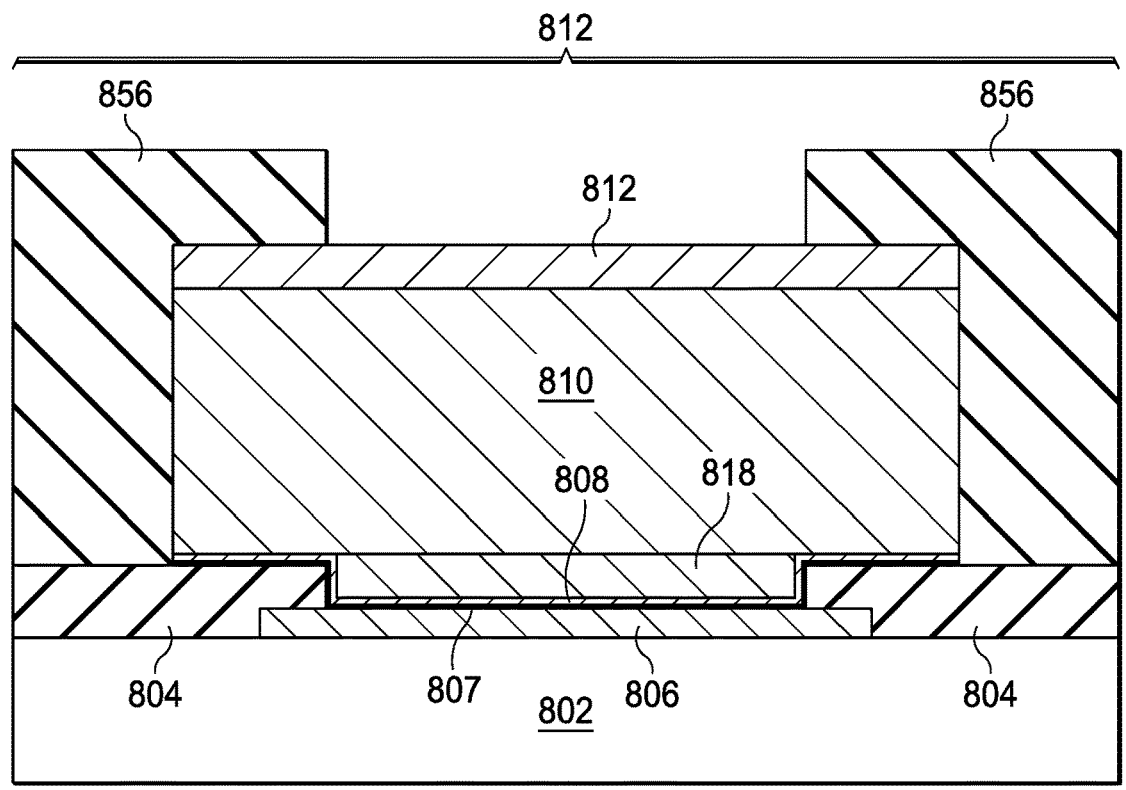
FIG. 8 is a cross sectional view of a copper pillar with a planar, un-dished surface covering topography.

FIG. 8 shows a cross section of a die 836 with an electroplated copper pillar 810 that has a planar, un-dished surface. In this example, a wire-bonded package is to be formed. In FIG. 8 similar reference labels are used for similar elements as are shown in FIGS. 1A-1B, for clarity. For example, substrate 802 in FIG. 8 corresponds to substrate 102 in FIGS. 1A-1B. In this arrangement, a layer of solderable metal 812 such as an electroplated layer of nickel followed by an electroplated layer of palladium, is electroplated on the surface of the copper pillar 810 following the electroplating of the copper pillar 810. Other solderable metals include silver, tin, gold, nickel, palladium, platinum, solder, and alloys thereof. A second layer of an overcoat layer (or protective overcoat or PO2) material 856 is deposited over the first overcoat layer 804 and over the copper pillar 810. An opening in the second overcoat 856 exposes a portion of the solderable metal 812 that covers the surface of the copper pillar 810.

Figure 9:
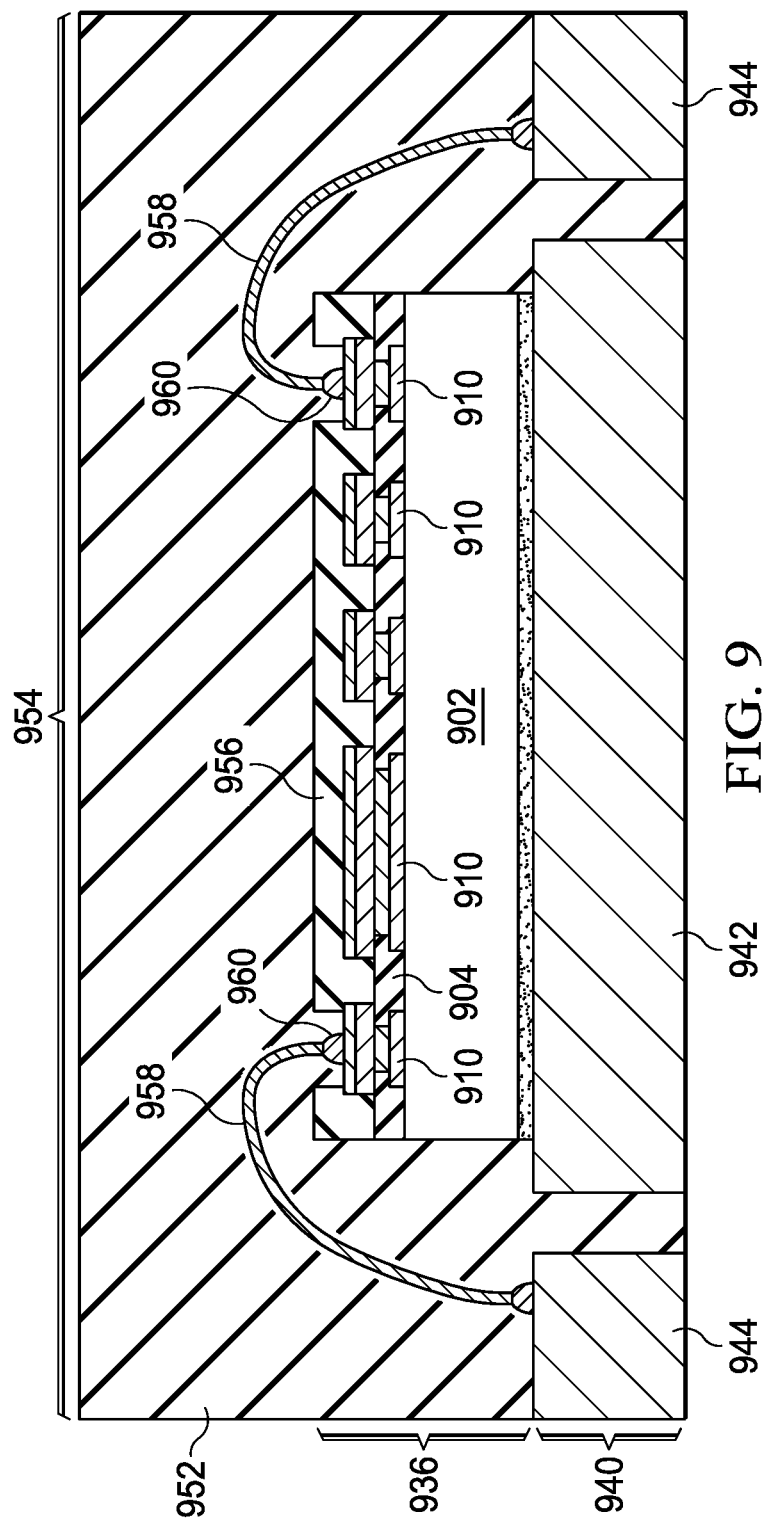
FIG. 9 is a cross section of a packaged die with wirebonds connecting copper pillars with planar, un-dished surfaces to leads on a lead frame.

In FIG. 9 similar reference labels are used for similar elements as are shown in FIGS. 1A-1B, for clarity. FIG. 9 shows the die 936 corresponding to 836 of FIG. 8 after it has been mounted on a die mount pad 942 of a lead frame 940. Wire bonds 958 electrically connect the solderable metal 912 on the surface of the copper pillars 910 on the die 936 to leads 944 on the lead frame 940. The die 936, the wire bonds 958 and a portion of the lead frame 940 are at least partially covered with mold compound 958 to form the packaged die 954. The packaged die 954 contains copper pillars with planar, un-dished surfaces. The planar, un-dished surfaces on the copper pillars 910 facilitate the formation of consistent and reliable ball bonds 960 which in turn reduces the failure rate of the packages dies 954 during manufacturing and reduces reliability failures of the packaged dies 954 in the field.

Modifications are possible in the described arrangements, and other alternative arrangements are possible within the scope of the claims.

What is claimed is:
1. A method, comprising:
   forming first openings in an overcoat on a semiconductor device to expose a surface of a conductive interconnect layer of the semiconductor device, the first openings having a first diameter, the overcoat having a first thickness over the conductive interconnect layer outside of the first openings;
   depositing a seed layer over the overcoat and on the exposed surface of the conductive interconnect layer in the first openings;
   depositing a first photoresist to a second thickness over the seed layer;

patterning second openings in the first photoresist, the second openings corresponding to the first openings;

forming conductive studs in the second openings and in the first openings contacting the exposed conductive interconnect layer, the conductive studs having a stud thickness that is approximately equal to the first thickness;

removing the first photoresist from the semiconductor device;

depositing a second photoresist over the seed layer, the second photoresist having a third thickness;

patterning third openings in the second photoresist exposing the conductive studs, the third openings having a second diameter greater than the first diameter;

forming conductive pillars in the third openings of the second photoresist and contacting the exposed surface of the conductive studs and overlying the surface of the overcoat surrounding the conductive studs;

stripping the second photoresist to expose the remaining seed layer; and etching the remaining exposed seed layer to remove the remaining exposed seed layer.

2. The method of claim 1, wherein a sum of the first thickness and the second thickness is less than twice the first diameter.

3. The method of claim 1, wherein the third thickness is less than twice the second diameter.

4. The method of claim 1, wherein forming the conductive studs further comprises forming one of copper and aluminum.

5. The method of claim 1 wherein forming the conductive studs further comprises forming copper studs.

6. The method of claim 5, wherein forming the copper studs further comprises electroplating copper.

7. The method of claim 1, wherein forming the conductive pillars further comprises forming copper pillars.

8. The method of claim 7, wherein forming the conductive pillars further comprises electroplating copper pillars.

9. The method of claim 1, and further comprising forming a solder cap on the conductive pillars prior to stripping the second photoresist.

10. The method of claim 1, and further comprising forming a layer of bondable material on the conductive pillars prior to stripping the second photoresist, the layer of bondable material being one selected from a group consisting essentially of: silver, tin, nickel, gold, palladium, electroplated nickel and immersion gold (ENIG), and electroplated nickel, electroplated palladium and immersion gold (ENEPIG), and alloys thereof.

11. A method, comprising:
forming conductive studs in first openings and second openings of a first photoresist, the conductive studs contacting an exposed conductive interconnect layer on a semiconductor device, the conductive studs having a stud thickness that is approximately equal to a first thickness; and forming conductive pillars in third openings of a second photoresist and contacting the exposed surface of the conductive studs and overlying a surface of an overcoat surrounding the conductive studs, wherein a top surface of the conductive studs is approximately coplanar with a top surface of the overcoat, the conductive pillars including a planar and un-dished surface facing away from the conductive studs and the overcoat.

12. The method of claim 11, wherein prior to forming conductive studs, the method includes:
forming the first openings in the overcoat on the semiconductor device to expose a surface of the conductive interconnect layer of the semiconductor device, the first openings having a first diameter, the overcoat having the first thickness over the conductive interconnect layer outside of the first openings;

depositing a seed layer over the overcoat and on the exposed surface of the conductive interconnect layer in the first openings;

depositing a first photoresist to a second thickness over the seed layer; and patterning second openings in the first photoresist, the second openings corresponding to the first openings.

13. The method of claim 11, wherein prior to forming conductive pillars, the method includes:
removing the first photoresist from the semiconductor device;

depositing the second photoresist over the seed layer, the second photoresist having a third thickness;

patterning third openings in the second photoresist exposing the conductive studs, the third openings having a second diameter greater than the first diameter.

14. The method of claim 11, wherein after forming conductive pillars, the method includes:
stripping the second photoresist to expose the remaining seed layer; and etching the remaining exposed seed layer to remove the remaining exposed seed layer.

15. The method of claim 11, wherein the conductive studs and conductive pillars include copper.

* * * * *